United States Patent
Sim et al.

(10) Patent No.: US 11,710,706 B2
(45) Date of Patent: Jul. 25, 2023

(54) METHOD OF DICING A SEMICONDUCTOR SUBSTRATE HAVING A SCRIBE LANE DEFINED THEREIN

(71) Applicant: SAMSUNG ELECTRONICS CO., LTD., Suwon-si (KR)

(72) Inventors: Hyun-Su Sim, Cheonan-si (KR); Yoon-Sung Kim, Seoul (KR); Yun-Hee Kim, Hwaseong-si (KR); Byung-Moon Bae, Daegu (KR); Jun-Ho Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/397,614

(22) Filed: Aug. 9, 2021

(65) Prior Publication Data

US 2021/0366837 A1 Nov. 25, 2021

Related U.S. Application Data

(63) Continuation of application No. 16/440,692, filed on Jun. 13, 2019, now Pat. No. 11,107,773.

(30) Foreign Application Priority Data

Nov. 22, 2018 (KR) .......................... 10-2018-0145198

(51) Int. Cl.
*H01L 23/544* (2006.01)
*H01L 21/78* (2006.01)

(52) U.S. Cl.
CPC ............ *H01L 23/544* (2013.01); *H01L 21/78* (2013.01); *H01L 2223/5446* (2013.01); *H01L 2223/54426* (2013.01)

(58) Field of Classification Search
CPC .................. H01L 23/544; H01L 21/78; H01L 2223/54426; H01L 2223/5446; H01L 22/32; H01L 22/34; H01L 27/02; H01L 21/52; H01L 21/67092; H01L 21/67242; H01L 21/76
See application file for complete search history.

(56) References Cited

U.S. PATENT DOCUMENTS

| 5,981,971 A | 11/1999 | Miyakawa |
| 6,921,683 B2 | 7/2005 | Nakayama |

(Continued)

FOREIGN PATENT DOCUMENTS

| CN | 104347355 | 2/2015 |
| CN | 105336711 | 2/2016 |

(Continued)

*Primary Examiner* — Kyoung Lee
*Assistant Examiner* — Christina A Sylvia
(74) *Attorney, Agent, or Firm* — F. Chau & Associates, LLC

(57) ABSTRACT

A semiconductor device includes a semiconductor substrate having a scribe lane defined therein. A plurality of semiconductor chips is formed on an upper surface of the semiconductor substrate. At least one conductive structure is arranged on an upper surface of the semiconductor substrate, within the scribe lane thereof. A fillet is arranged on at least one side surface of the conductive structure. The fillet is configured to induce a cut line which spreads along the scribe lane, through a central portion of the conductive structure.

20 Claims, 10 Drawing Sheets

(56) References Cited

U.S. PATENT DOCUMENTS

| | | | |
|---|---|---|---|
| 7,727,812 B2 | 6/2010 | Jung | |
| 8,980,655 B2 | 3/2015 | Okada et al. | |
| 9,406,625 B2 | 8/2016 | Wang et al. | |
| 9,541,601 B2 | 1/2017 | Pagani | |
| 9,831,194 B1* | 11/2017 | Lee | H01L 23/544 |
| 2006/0012012 A1* | 1/2006 | Wang | H01L 23/562 |
| | | | 257/E23.194 |
| 2009/0057842 A1* | 3/2009 | He | H01L 22/32 |
| | | | 257/E23.179 |
| 2013/0299947 A1* | 11/2013 | Uehling | H01L 22/20 |
| | | | 257/E23.179 |
| 2020/0168556 A1 | 5/2020 | Sim et al. | |

FOREIGN PATENT DOCUMENTS

| | | |
|---|---|---|
| CN | 107680954 | 2/2018 |
| JP | 10-256324 | 9/1998 |
| JP | 2005-340423 | 12/2005 |
| JP | 2007-335459 | 12/2007 |
| JP | 2011-054632 | 3/2011 |
| KR | 10-0172557 | 10/1998 |
| KR | 10-1999-0000220 | 1/1999 |
| KR | 10-0800786 | 1/2008 |
| KR | 10-2009-0057696 | 6/2009 |

* cited by examiner

METHOD OF DICING A SEMICONDUCTOR SUBSTRATE HAVING A SCRIBE LANE DEFINED THEREIN

CROSS-RELATED APPLICATION

This application is a Continuation of co-pending U.S. patent application Ser. No. 16/440,692, filed on Jun. 13, 2019, which claims priority under 35 USC § 119 to Korean Patent Application No. 10-2018-0145198, filed on Nov. 22, 2018 in the Korean Intellectual Property Office (KIPO), the contents of which are herein incorporated by reference in their entirety.

TECHNICAL FIELD

The present disclosure relates to a semiconductor device and, more particularly, to a semiconductor device, a semiconductor chip formed from the semiconductor device, and a method of dicing a semiconductor substrate including the semiconductor device.

DISCUSSION OF THE RELATED ART

Generally, a plurality of semiconductor chips, or dies, formed on a single semiconductor substrate, or wafer, may be divided ("diced") along scribe lanes. Various conductive structures, such as a test element group (TEG), an alignment key, etc., may be arranged in the scribe lanes.

To cut the semiconductor substrate, a laser may be used to cut along the scribe lane to form a cut line at the scribe lane and the conductive structures. The cut line may spread along a side surface of each of the conductive structures that are within the scribe lanes.

In this case, either of the two semiconductor dies at both sides of the scribe lane may include the conductive structure without the cut line. The conductive structure may therefore protrude from a side surface of the semiconductor die and this protrusion may cause a short, a leakage current, etc., in subsequent processing steps.

While some dies may have a conductive structure protruding therefrom, other dies may have a groove in which the conductive structure may be positioned. The groove may function as a crack seed of the semiconductor die. Further, the groove may function as a void in a following molding process.

SUMMARY

A semiconductor device includes a semiconductor substrate having a scribe lane defined therein. A plurality of semiconductor chips is formed on an upper surface of the semiconductor substrate. At least one conductive structure is arranged on an upper surface of the semiconductor substrate, within the scribe lane thereof. A fillet is arranged on at least one side surface of the conductive structure. The fillet is configured to induce a cut line which spreads along the scribe lane, through a central portion of the conductive structure.

A semiconductor chip includes an internal circuit. At least one conductive structure is arranged alongside the internal circuit. A fillet is arranged on at least one side surface of the conductive structure.

A method of dicing a semiconductor substrate includes forming a fillet on at least one side surface of at least one conductive structure on an upper surface of a scribe lane of the semiconductor substrate on which a plurality of semiconductor chips are formed. A laser is directed to the scribe lane to form a cut line along central portions of the scribe lane, the fillet, and the conductive structure.

BRIEF DESCRIPTION OF THE DRAWINGS

Exemplary embodiments of the present disclosure will be more clearly understood from the following detailed description taken in conjunction with the accompanying drawings.

FIG. 1 is a plan view illustrating a semiconductor device in accordance with exemplary embodiments of the present disclosure;

FIG. 2 is a cross-sectional view taken along a line II-II' in FIG. 1;

FIG. 3 is a cross-sectional view taken along a line III-III' in FIG. 1;

FIG. 4 is an enlarged cross-sectional view of a portion "IV" in FIG. 2;

FIG. 5 is a perspective view illustrating a TEG and a fillet in FIG. 1;

FIG. 6 is a cross-sectional view taken along a line VI-VI' in FIG. 1;

FIG. 7 is a plan view illustrating a semiconductor device in accordance with exemplary embodiments of the present disclosure;

FIG. 8 is a cross-sectional view taken along a line VIII-VIII' in FIG. 7;

FIG. 9 is a cross-sectional view taken along a line XI-XI' in FIG. 7;

FIG. 10 is a perspective view illustrating a TEG and a fillet in FIG. 7;

FIG. 11 is a cross-sectional view illustrating a semiconductor device in accordance with exemplary embodiments of the present disclosure;

FIG. 12 is a cross-sectional view illustrating a semiconductor device in accordance with exemplary embodiments of the present disclosure;

FIGS. 13 to 16 are cross-sectional views illustrating a method of dicing a semiconductor substrate in accordance exemplary embodiments of the present disclosure; and FIG. 17 is a cross-sectional view illustrating a method of dicing a semiconductor substrate in accordance with exemplary embodiments of the present disclosure.

FIG. 18 is a cross-sectional view illustrating a method of dicing a semiconductor substrate in accordance with exemplary embodiments of the present disclosure.

FIG. 19 is a cross-sectional view illustrating a method of dicing a semiconductor substrate in accordance with exemplary embodiments of the present disclosure.

FIG. 20 is a cross-sectional view illustrating a method of dicing a semiconductor substrate in accordance with exemplary embodiments of the present disclosure.

DETAILED DESCRIPTION OF THE EMBODIMENTS

Hereinafter, exemplary embodiments of the present disclosure will be explained in detail with reference to the accompanying drawings.

Semiconductor Device

Figure 1:
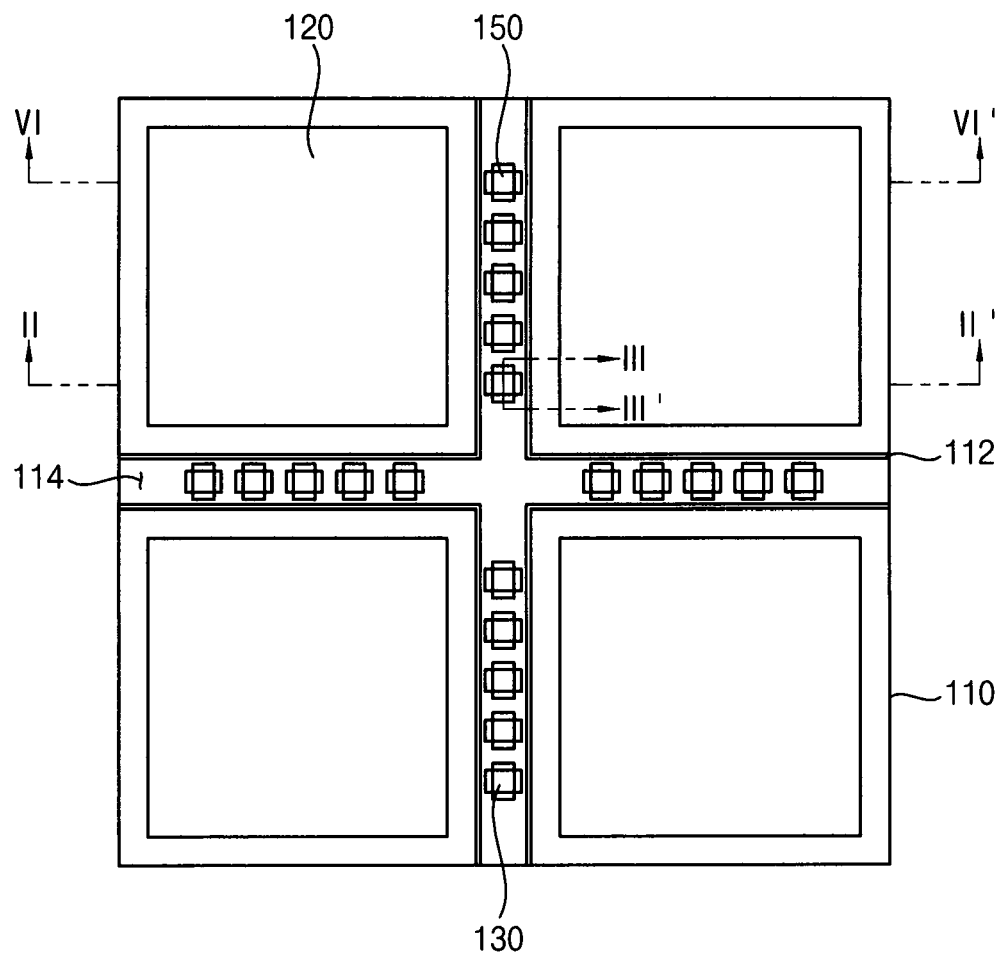
FIGS. 1 to 20 illustrate various exemplary embodiments of the present disclosure, as described herein.
Figure 2:
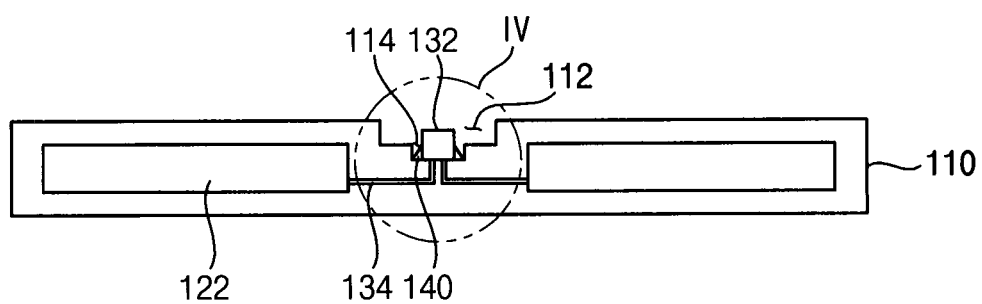
Figure 3:
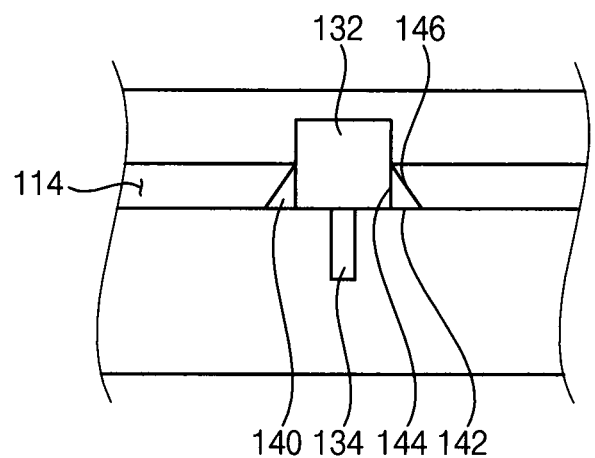
Figure 4:
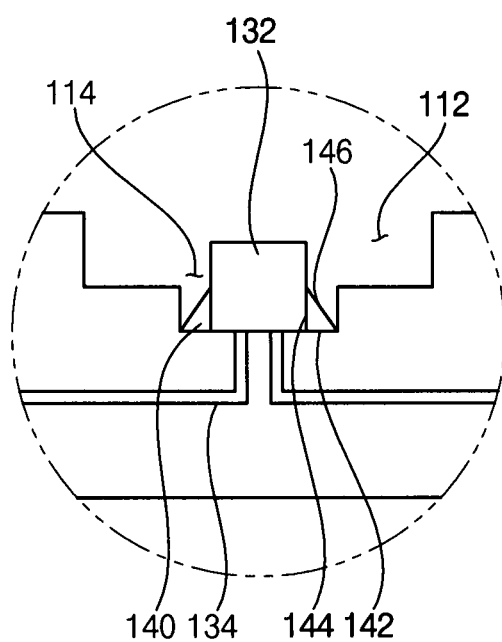
Figure 5:
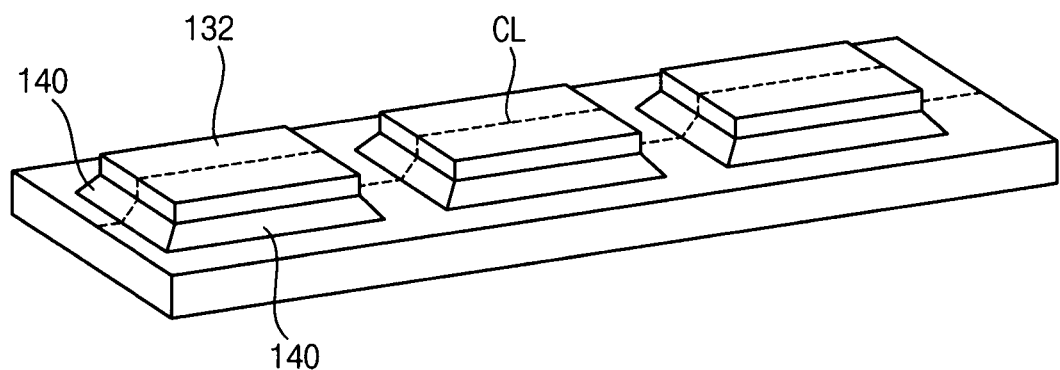
Figure 6:
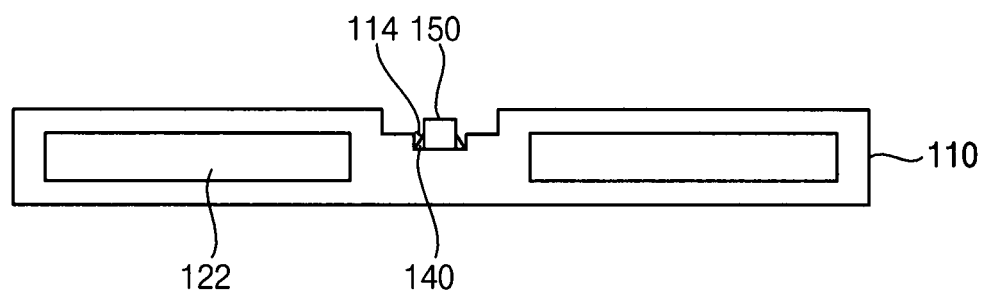

FIG. 1 is a plan view illustrating a semiconductor device in accordance with exemplary embodiments of the present disclosure. FIG. 2 is a cross-sectional view taken along line II-II' of FIG. 1. FIG. 3 is a cross-sectional view taken along line III-III' of FIG. 1. FIG. 4 is an enlarged cross-sectional view of a portion "IV" of FIG. 2. FIG. 5 is a perspective view illustrating a TEG and a fillet of FIG. 1. FIG. 6 is a cross-sectional view taken along line VI-VI' of FIG. 1.

Referring to FIGS. 1 to 6, a semiconductor device of may include a semiconductor substrate 110, a plurality of semiconductor chips (or dies) 120, a conductive structure, and a fillet 140.

The semiconductor chips 120 may be arranged on an upper surface of the semiconductor substrate 110. The semiconductor chips 120 may be partitioned by scribe lanes 112 of the semiconductor substrate 110. In exemplary embodiments of the present disclosure, the scribe lanes 112 may have a cross shape.

The conductive structure may be arranged on an upper surface of the scribe lane 112. In exemplary embodiments of the present disclosure, the conductive structure may include a plurality of test element groups (TEG) and an alignment key 150. The TEGs may be used for testing the semiconductor chips 120. The alignment key 150 may be used for aligning the semiconductor substrate 110.

Each of the TEGs may include a test pad 132 and a test line 134. The test pad 132 may be arranged on the upper surface of the scribe lane 112. The test pad 132 may have a rectangular parallelepiped shape. Thus, the test pad 132 may have four side surfaces substantially perpendicular to the scribe lane 112. The test line 134 may be electrically connected between the test pad 132 and the semiconductor chip 120. For example, the test line 134 may be extended from a lower surface of the test pad 132. The test line 134 may be connected to an internal circuit 122 of the semiconductor chip 120.

The fillet 140 may be arranged on at least one side surface of the TEG. In exemplary embodiments of the present disclosure, the fillet 140 may be arranged on the four side surfaces of the test pad 132. The fillet 140 may include an insulating material. The fillet 140 may be positioned in a receiving groove 114 on the upper surface of the scribe lane 112. The receiving groove 114 may be formed along a lengthwise direction of the scribe lane 112. The receiving groove 114 may have a width greater than that of the test pad 132 to expose the four side surfaces of the test pad 132 through the receiving groove 114. Here, the width of the test pad 132 may be a length measured along a direction substantially perpendicular to the lengthwise direction of the scribe lane 112.

As may be seen in FIG. 3, the fillet 140 may have a lower surface 142, a side surface 144 and a slant upper surface 146. The fillet 140 may be shaped substantially as a right triangle, as shown, with the lower surface 142 being an adjacent side of the triangle, the side surface 144 being an opposite side of the triangle, and the slant upper surface 146 being a hypotenuse of the triangle. The lower surface 142 of the fillet 140 may be configured to make contact with the upper surface of the scribe lane 112. The side surface 144 of the fillet 140 may be extended from the lower surface 142. The side surface 144 of the fillet 140 may be configured to make contact with the side surface of the test pad 132. The slant upper surface 146 of the fillet 140 may be connected between the side surface 144 and the lower surface 142. The side surface 144 of the fillet 140 may have an upper end that may be lower than the side surface of the test pad 132. Alternatively, the side surface 144 of the fillet 140 may have an upper end substantially coplanar with the side surface of the test pad 132.

The slant upper surface 146 of the fillet 140 may provide a gradual slant structure to connect the scribe lane 112 and the test pad 132. Thus, when the scribe lane 112 may be diced using a laser, a cut line CL may spread along the lengthwise direction of the scribe lane 112 (as may be seen in FIG. 5). The cut line CL may then be transmitted to the test pad 132 along the slant upper surface 146 of the fillet 140. For example, the cut line CL may spread along a central portion of the test pad 132. As a result, the test pad 132 may be divided into equal halves along the cut line CL so that each of the semiconductor chips 120 at both sides of the scribe lane 112 may include the half of the test pad 132.

Further, the fillet 140 may be arranged on at least one side surface among four side surfaces of the alignment key 150. In exemplary embodiments of the present disclosure, the fillet 140 may be arranged on the four side surfaces of the alignment key 150. Thus, the receiving groove 114 having the width greater than that of the scribe lane 112 may expose the four side surfaces of the alignment key 150. The fillet 140 may be arranged in the receiving groove 114 and configured to at least partially surround the alignment key 150.

The fillet 140 on the alignment key 150 may have a structure and may function substantially the same as those of the fillet 140 on the TEG. Thus, any further illustrations with respect to the structure and the functions of the fillet 140 on the alignment key 150 may be omitted herein for brevity. It may be assumed that any omitted details are at least similar to corresponding details that have already been described herein.

The slant upper surface 146 of the fillet 140 may also provide the gradual connection between the scribe lane 112 and the alignment key 150. Thus, when the scribe lane 112 may be diced using a laser, the cut line CL may spread along the lengthwise direction of the scribe lane 112. The cut line CL may then be transmitted to the alignment key 150 through the slant upper surface 146 of the fillet 140. For example, the cut line CL may spread along a central portion of the alignment key 150. As a result, the alignment key 150 may be divided into equal halves so that each of the semiconductor chips 120 at both sides of the scribe lane 112 may include the half of the alignment key ISO.

Figure 7:
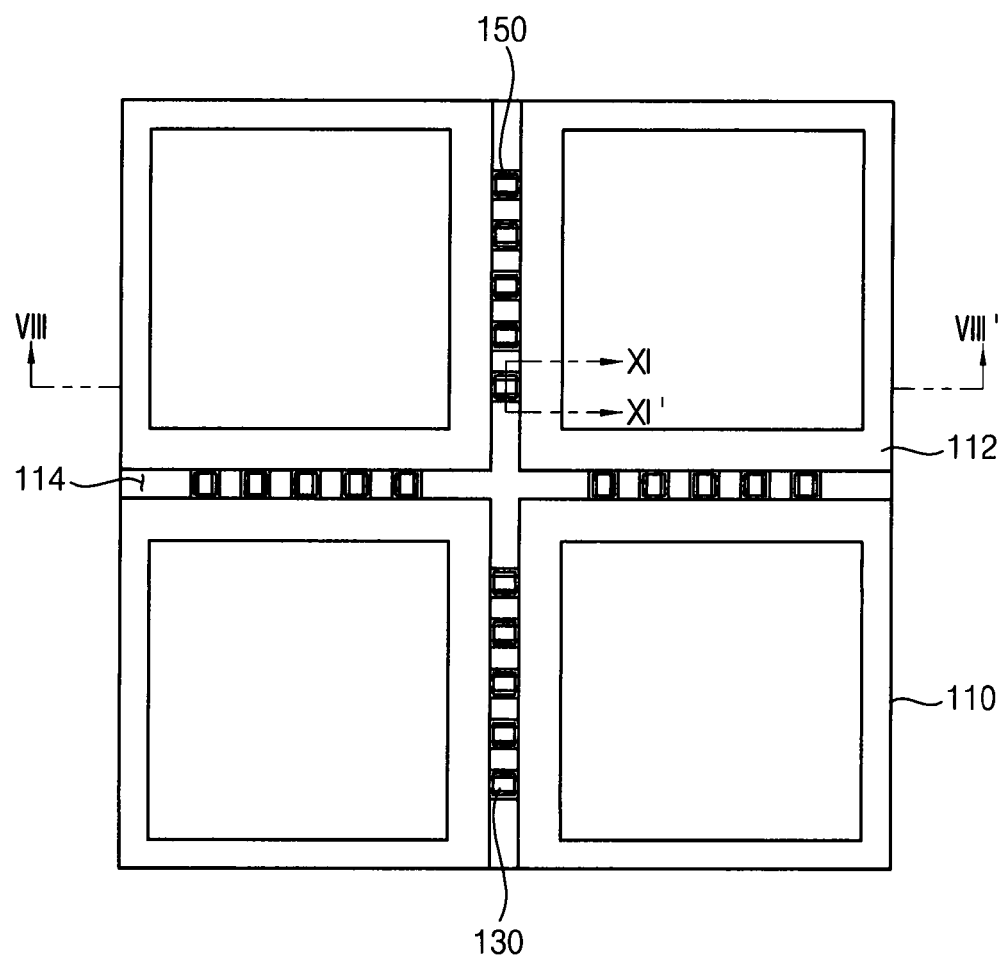
Figure 8:
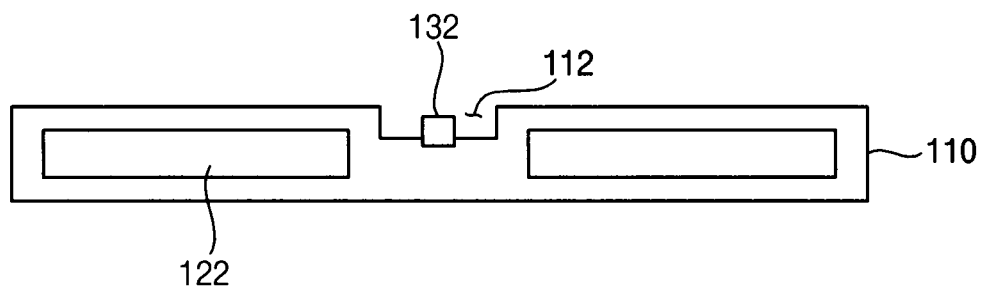
Figure 9:
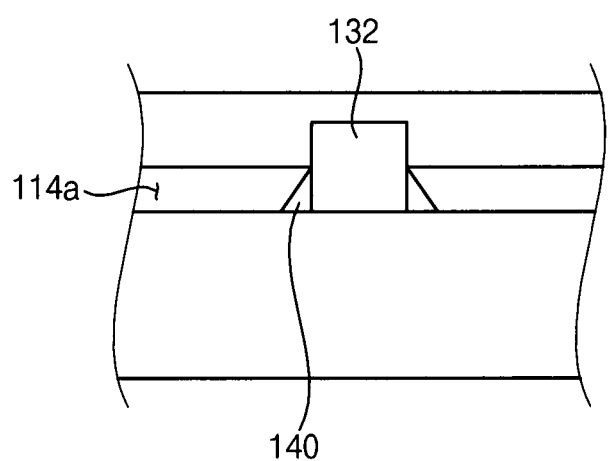
Figure 10:
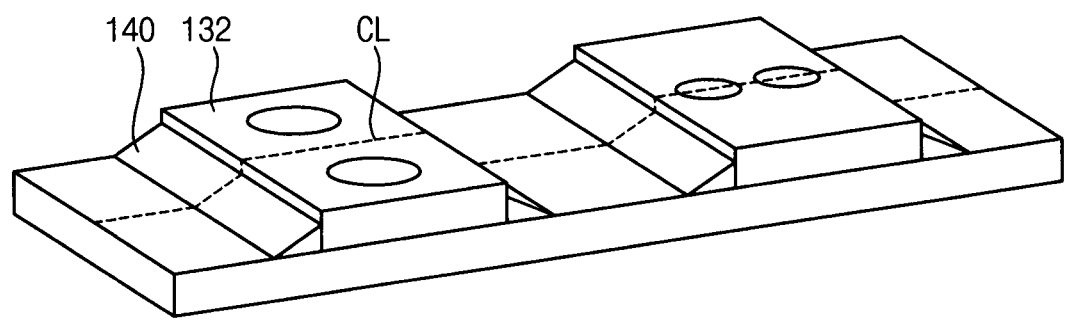

FIG. 7 is a plan view illustrating a semiconductor device in accordance with exemplary embodiments of the present disclosure. FIG. 8 is a cross-sectional view taken along line VIII-VIII' of FIG. 7. FIG. 9 is a cross-sectional view taken along line XI-XI' in FIG. 7. FIG. 10 is a perspective view illustrating a TEG and a fillet of FIG. 7.

A semiconductor device may include elements substantially the same as those of the semiconductor device shown in FIG. 1 except for a TEG. Thus, the same reference numerals may refer to the same elements and any further illustrations with respect to the same element may be omitted herein for brevity. It may be assumed that any omitted details are at least similar to corresponding details that have already been described herein.

Referring to FIGS. 7 to 10, a TEG may be directly connected with the semiconductor chips 120. For example, a test pad of the TEG may have first opposite surfaces electrically connected to the internal circuit 122 of the semiconductor chip 120. The first opposite side surfaces of the TEG may be oriented toward the semiconductor chips 120 at both sides of the scribe lane 112. Thus, an electrical connection structure may be arranged between the first opposite side surfaces of the TEG and the semiconductor chips 120 so that a receiving groove 114a might not be formed at the scribe lane 112 between the first opposite side surfaces of the TEG and the semiconductor chips 120. As a result, the receiving groove 114a may be formed only along the lengthwise direction of the scribe lane 112, i.e., a direction of the cut line CL, as is shown in FIG. 9. Therefore, the second opposite side surfaces of the TEG on the cut line CL, which may be substantially perpendicular to the first opposite side surfaces, may be exposed through the receiving groove 114a.

Because the fillet 140 may be arranged in the receiving groove 114a, the fillet 140 may be arranged on the second opposite side surfaces of the TEG on the cut line CL. Although the fillet 140 may be arranged on the second opposite side surfaces of the TEG, the cut line CL spreading along the scribe lane 112 may be formed along the central portion of the TEG.

Semiconductor Chip

Figure 11:
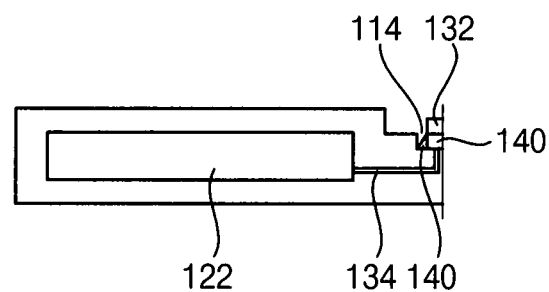

FIG. 11 is a cross-sectional view illustrating a semiconductor device in accordance with exemplary embodiments of the present disclosure.

Referring to FIG. 11, a semiconductor chip 120 may be formed by dicing the semiconductor substrate 110 in FIG. 1 along the scribe lane 112. Thus, the semiconductor chip 120 may include the internal circuit 122, the TEG, the fillet 140 and the alignment key 150.

Because the TEG, the fillet 140 and the alignment key 150 may be cut by one half by dicing the semiconductor substrate 110, the TEG in the semiconductor chip 120 may have a half of shape of the TEG in FIG. 1. The alignment key 150 in the semiconductor chip 120 may have a half of shape of the alignment key 150 in FIG. 1. The fillet 140 in the semiconductor chip 120 may have a half of shape of the fillet 140 in FIG. 1. In contrast, because the fillet 140 on an inner surface of the TEG oriented toward the internal circuit 122 might not be cut, the fillet 140 on the inner surface of the TEG oriented toward the internal circuit 122 may have a shape substantially the same as that of the fillet 140 in FIG. 1. For example, the fillet 140 may be arranged on the three side surfaces of the TEG except for an outer side surface of the TEG.

Figure 12:
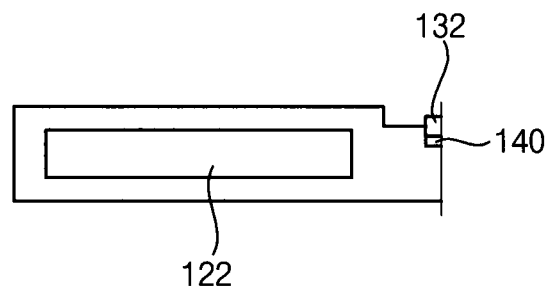

FIG. 12 is a cross-sectional view illustrating a semiconductor device in accordance with exemplary embodiments of the present disclosure.

Referring to FIG. 12, a semiconductor chip 120 may be formed by dicing the semiconductor substrate 110 in FIG. 7 along the scribe lane 112. Thus, the semiconductor chip 120 may include the internal circuit 122, the TEG, the fillet 140, and the alignment key 150.

Because the TEG, the fillet 140, and the alignment key 150 may be cut by one half by dicing the semiconductor substrate 110, the TEG in the semiconductor chip 120 may have half of the shape of the TEG in FIG. 7. The alignment key 150 in the semiconductor chip 120 may have a half of shape of the alignment key 150 in FIG. 7. The fillet 140 in the semiconductor chip 120 may have half of the shape of the fillet 140 in FIG. 7. For example, the fillet 140 may be arranged on the opposite side surfaces of the TEG on the cut line CL.

Method of Dicing a Semiconductor Substrate

FIGS. 13 to 16 are cross-sectional views illustrating a method of dicing a semiconductor substrate in accordance with exemplary embodiments of the present disclosure. This method may be applied to the semiconductor substrate 110 in FIG. 1.

Figure 13:
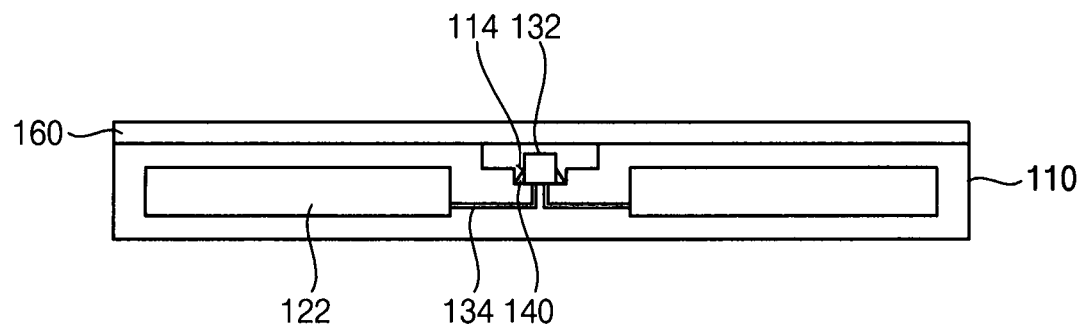

Referring to FIG. 13, a die attach film 160 may be attached to the upper surface of the semiconductor substrate 110.

Figure 14:
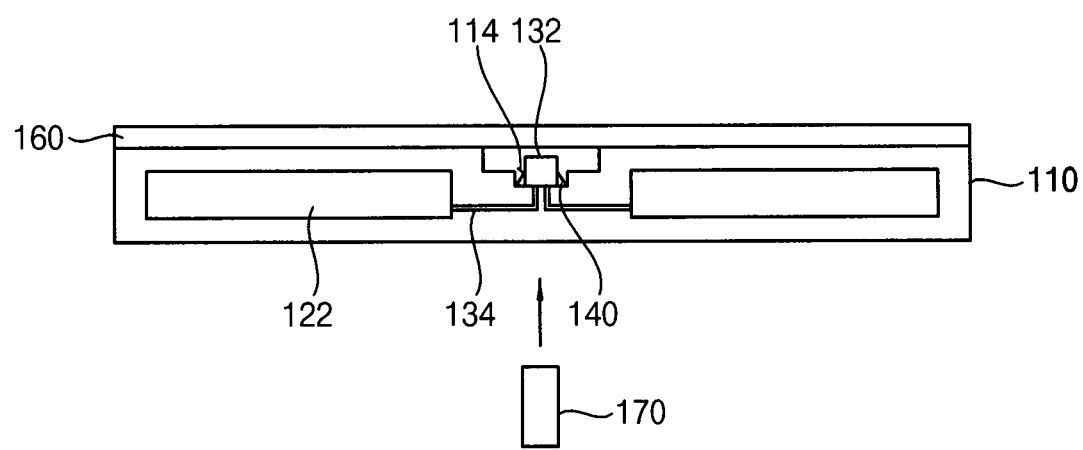

Referring to FIG. 14, a laser 170 may be arranged under the semiconductor substrate 110. The laser 170 may direct a laser beam to a lower surface of the scribe lane 112.

Figure 15:
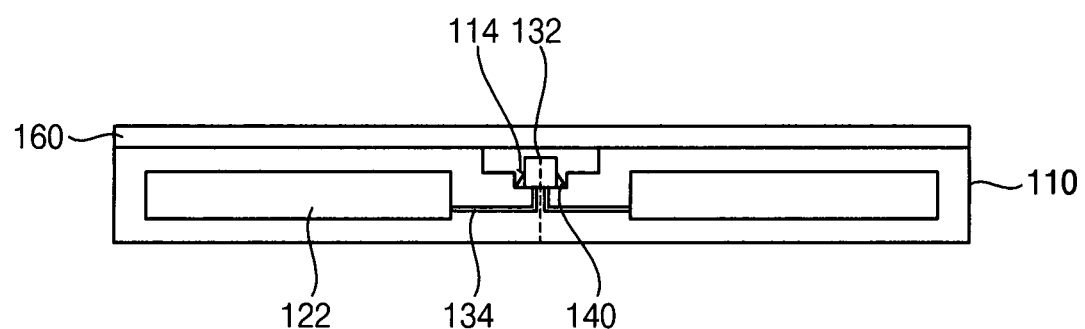

Referring to FIG. 15, the cut line CL may be formed in the scribe lane 112 by the laser. The cut line CL may spread along the lengthwise direction of the scribe lane 112.

As mentioned above, the fillet 140 may provide the gradual slant structure between the scribe lane 112 and the TEG. Thus, the cut line CL may spread along the central portion of the TEG through the central portion of the fillet 140. The cut line CL may also spread along the central portion of the alignment key 150 by the fillet 140.

Therefore, the TEG and the alignment key 150 may be divided into one half. As a result, the semiconductor chips 120 at both side surfaces of the scribe lane 112 may have half of the TEG and the alignment key 150.

Figure 16:
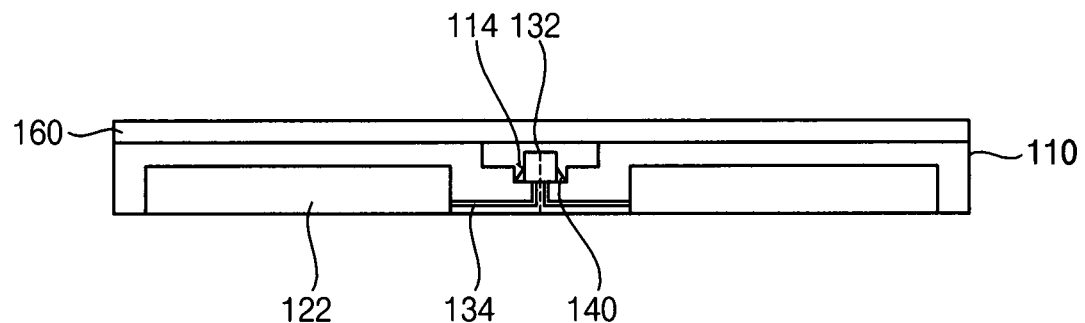

Referring to FIG. 16, the lower surface of the semiconductor substrate 110 may be partially removed by a grinding process to reduce a thickness of the semiconductor substrate 110. The spreading of the cut line CL may be promoted by the grinding process so that the semiconductor chips 120 may be separated along the scribe lane 112.

The die attach film 160 may be removed to complete the semiconductor chip 120 in FIG. 11.

FIGS. 17 to 20 are cross-sectional views illustrating a method of dicing a semiconductor substrate in accordance exemplary embodiments of the present disclosure.

Figure 17:
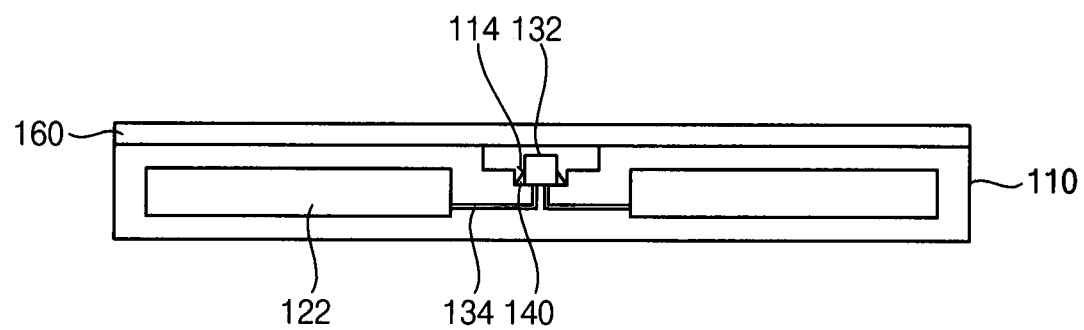

Referring to FIG. 17, the die attach film 160 may be attached to the upper surface of the semiconductor substrate 110.

Figure 18:
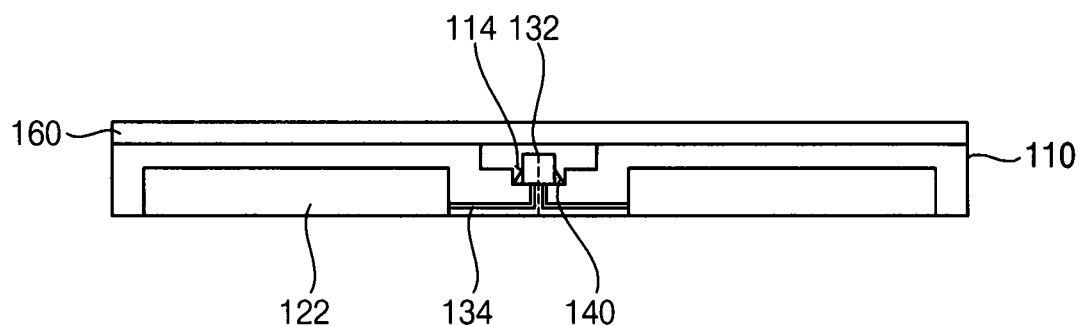

Referring to FIG. 18, the lower surface of the semiconductor substrate 110 may be partially removed by a grinding process to reduce a thickness of the semiconductor substrate 110.

Figure 19:
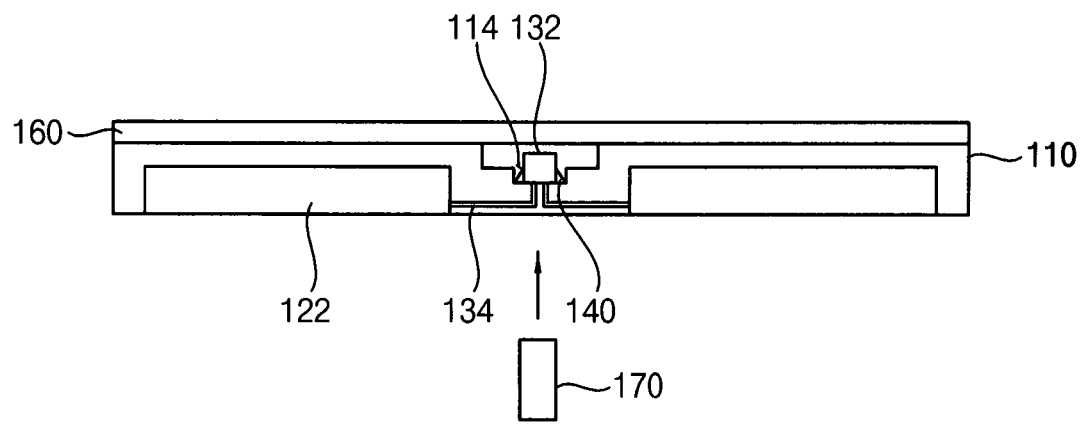

Referring to FIG. 19, the laser 170 may be arranged under the semiconductor substrate 110. The laser 170 may direct a laser beam to the lower surface of the scribe lane 112.

Figure 20:
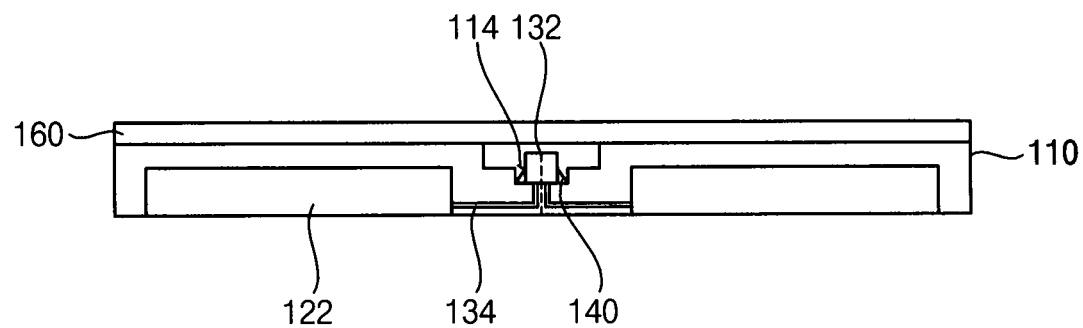

Referring to FIG. 20, the cut line CL may be formed in the scribe lane 112 by the laser. The cut line CL may spread along the lengthwise direction of the scribe lane 112.

As mentioned above, the fillet 140 may provide the gradual slant structure between the scribe lane 112 and the TEG. Thus, the cut line CL may spread along the central portion of the TEG through the central portion of the fillet 140. The cut line CL may also spread along the central portion of the alignment key 150 by the fillet 140.

Therefore, the TEG and the alignment key 150 may be divided into halves. As a result, the semiconductor chips 120 at both side surfaces of the scribe lane 112 may have the half of the TEG and the alignment key 150.

The die attach film 160 may be removed to complete the semiconductor chip 120 in FIG. 12.

According to exemplary embodiments of the present disclosure, the fillet may be arranged on the side surface of the conductive structure so that the cut line may spread along the central portion of the conductive structure due to the fillet. Thus, the conductive structure might not be torn toward any one of the semiconductor chips. As a result, a crack, a short, a leakage current, etc., might not be generated in the semiconductor chips at either sides of the scribe lane.

The foregoing is illustrative of exemplary embodiments of the present disclosure and is not to be construed as limiting thereof. Although a few exemplary embodiments of the present disclosure have been described, those skilled in the art will readily appreciate that many modifications are possible without materially departing from the novel teachings and aspects of the present invention. Accordingly, all such modifications are intended to be included within the scope of the present disclosure.

What is claimed is:

1. A method of dicing a semiconductor substrate, the method comprising:
   forming a fillet on at least one side surface of at least one conductive structure on an upper surface of a scribe lane of the semiconductor substrate on which a plurality of semiconductor chips are formed;
   forming a test pad on the upper surface of the scribe lane; and
   directing a laser to the scribe lane to form a cut line along central portions of the scribe lane, the fillet, and the conductive structure,
   wherein the fillet is arranged on opposite side surfaces of the test pad, exclusively within the scribe lane, and wherein the fillet comprises an insulating material.

2. The method of claim 1, wherein forming the fillet comprises forming the fillet on the at least one side surface of the at least one conductive structure on the cut line.

3. The method of claim 1, wherein the fillet comprises:
   a lower surface contacting the scribe lane;
   a side surface extended from the lower surface to make contact with the side surface of the conductive structure; and
   a slant upper surface connected between the lower surface and the side surface.

4. The method of claim 3, wherein the side surface of the fillet has an upper end substantially coplanar with the side surface of the conductive structure.

5. The method of claim 3, wherein the side surface of the fillet has an upper end that is, lower than the side surface of the conductive structure.

6. The method of claim 1, wherein the test pad has a side surface electrically connected with the plurality of semiconductor chips, and forming the fillet comprises forming the fillet on side surfaces of the test pad on the cut line.

7. The method of claim 1, wherein a test line is extended from a lower surface of the test pad and the test line is connected to the plurality of semiconductor chip, and forming the fillet comprises forming the fillet on entire side surfaces of the test pad.

8. The method of claim 1, wherein the at least one conductive structure comprises an alignment key aligning the semiconductor substrate, and forming the fillet comprises forming the fillet on entire side surfaces of the alignment key.

9. The method of claim 1, further comprising partially removing a lower surface of the semiconductor substrate.

10. The method of claim 9, wherein the lower surface of the semiconductor substrate is removed before directing the laser to the scribe lane.

11. The method of claim 7, wherein the lower surface of the semiconductor substrate is removed after directing the laser to the scribe lane.

12. A method of dicing a semiconductor substrate, the method comprising:
    forming a fillet on at least one side surface of at least one conductive structure on an upper surface of a scribe lane of the semiconductor substrate on which a plurality of semiconductor chips are formed;
    forming a test pad on the upper surface of the scribe lane; and
    directing a laser to the scribe lane to form a cut line along central portions of the scribe lane, the fillet, and the conductive structure,
    wherein the fillet is arranged on opposite side surfaces of the test pad and wherein the fillet comprises an insulating material, and
    wherein forming the fillet comprises:
        removing the scribe lane adjacent to the at least one side surface of the at least one conductive structure to form a receiving groove; and
        forming the fillet in the receiving groove.

13. A method of dicing a semiconductor substrate, the method comprising:
    forming a fillet on at least one side surface of at least one conductive structure on an upper surface of a scribe lane of the semiconductor substrate on which a plurality of semiconductor chips are formed; and
    directing a laser to the scribe lane to form a cut line along central portions of the scribe lane, the fillet, and the conductive structure,
    wherein the at least one conductive structure comprises a test element group (TEG) testing the plurality of semiconductor chips.

14. The method of claim 13, wherein forming the fillet comprises forming the fillet on the at least one side surface of the at least one conductive structure on the cut line.

15. The method of claim 13, wherein forming the fillet comprises:
    removing the scribe lane adjacent to the at least one side surface of the at least one conductive structure to form a receiving groove; and
    forming the fillet in the receiving groove.

16. The method of claim 13, wherein the TEG comprises a test pad having a side surface electrically connected with the plurality of semiconductor chips, and forming the fillet comprises forming the fillet on side surfaces of the test pad on the cut line.

17. The method of claim 13, wherein the TEG comprises a test pad and a test line extended from a lower surface of the test pad and connected to the plurality of semiconductor chip, and forming the fillet comprises forming the fillet on entire side surfaces of the test pad.

18. The method of claim 13, wherein the at least one conductive structure comprises an alignment key aligning the semiconductor substrate, and forming the fillet comprises forming the fillet on entire side surfaces of the alignment key.

19. The method of claim 13, further comprising partially removing a lower surface of the semiconductor substrate.

20. The method of claim 19, wherein the lower surface of the semiconductor substrate is removed before directing the laser to the scribe lane.

* * * * *